United States Patent
Fuergut et al.

(10) Patent No.: US 12,136,623 B2
(45) Date of Patent: Nov. 5, 2024

(54) MULTI-DEVICE SEMICONDUCTOR CHIP WITH ELECTRICAL ACCESS TO DEVICES AT EITHER SIDE

(71) Applicant: Infineon Technologies Austria AG, Villach (AT)

(72) Inventors: Edward Fuergut, Dasing (DE); Peter Friedrichs, Nuremberg (DE); Ralf Otremba, Kaufbeuren (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 894 days.

(21) Appl. No.: 17/095,389

(22) Filed: Nov. 11, 2020

(65) Prior Publication Data
US 2022/0149038 A1    May 12, 2022

(51) Int. Cl.
| | | |
|---|---|---|
| H01L 27/06 | (2006.01) | |
| H01L 23/00 | (2006.01) | |
| H01L 23/31 | (2006.01) | |
| H01L 23/538 | (2006.01) | |
| H01L 29/16 | (2006.01) | |
| H01L 29/739 | (2006.01) | |
| H01L 29/78 | (2006.01) | |

(52) U.S. Cl.
CPC .......... *H01L 27/0635* (2013.01); *H01L 23/31* (2013.01); *H01L 23/5386* (2013.01); *H01L 24/09* (2013.01); *H01L 29/1608* (2013.01); *H01L 29/7393* (2013.01); *H01L 29/78* (2013.01)

(58) Field of Classification Search
CPC . H01L 29/1608; H01L 29/7393; H01L 29/78; H01L 27/0635; H01L 24/09; H01L 23/31; H01L 23/5386
USPC ............................................................ 257/77
See application file for complete search history.

(56) References Cited

U.S. PATENT DOCUMENTS

| | | |
|---|---|---|
| 9,263,563 B2 | 2/2016 | Otremba et al. |
| 11,444,036 B2 * | 9/2022 | Hong .................... H01L 23/367 |
| 2002/0033130 A1 | 3/2002 | Hisada et al. |
| 2002/0060330 A1 | 5/2002 | Onishi et al. |
| 2006/0202320 A1 | 9/2006 | Schaffer |
| 2006/0261473 A1 | 11/2006 | Connah et al. |
| 2008/0006923 A1 | 1/2008 | Otremba |
| 2009/0236749 A1 | 9/2009 | Otremba et al. |
| 2018/0151481 A1 | 5/2018 | Otremba et al. |

FOREIGN PATENT DOCUMENTS

CN          105789293 A       7/2016

* cited by examiner

*Primary Examiner* — Monica D Harrison
(74) *Attorney, Agent, or Firm* — Murphy, Bilak & Homiller, PLLC

(57) ABSTRACT

A semiconductor chip includes a semiconductor body having a main surface and a rear surface opposite the main surface, a first bond pad disposed on the main surface, a second bond pad disposed on the rear surface, a first switching device that is monolithically integrated in the semiconductor body and has a first input-output terminal that is electrically connected to the first bond pad, and a second switching device that is monolithically integrated in the semiconductor body and has a first input-output terminal that is electrically connected to the second bond pad.

12 Claims, 9 Drawing Sheets

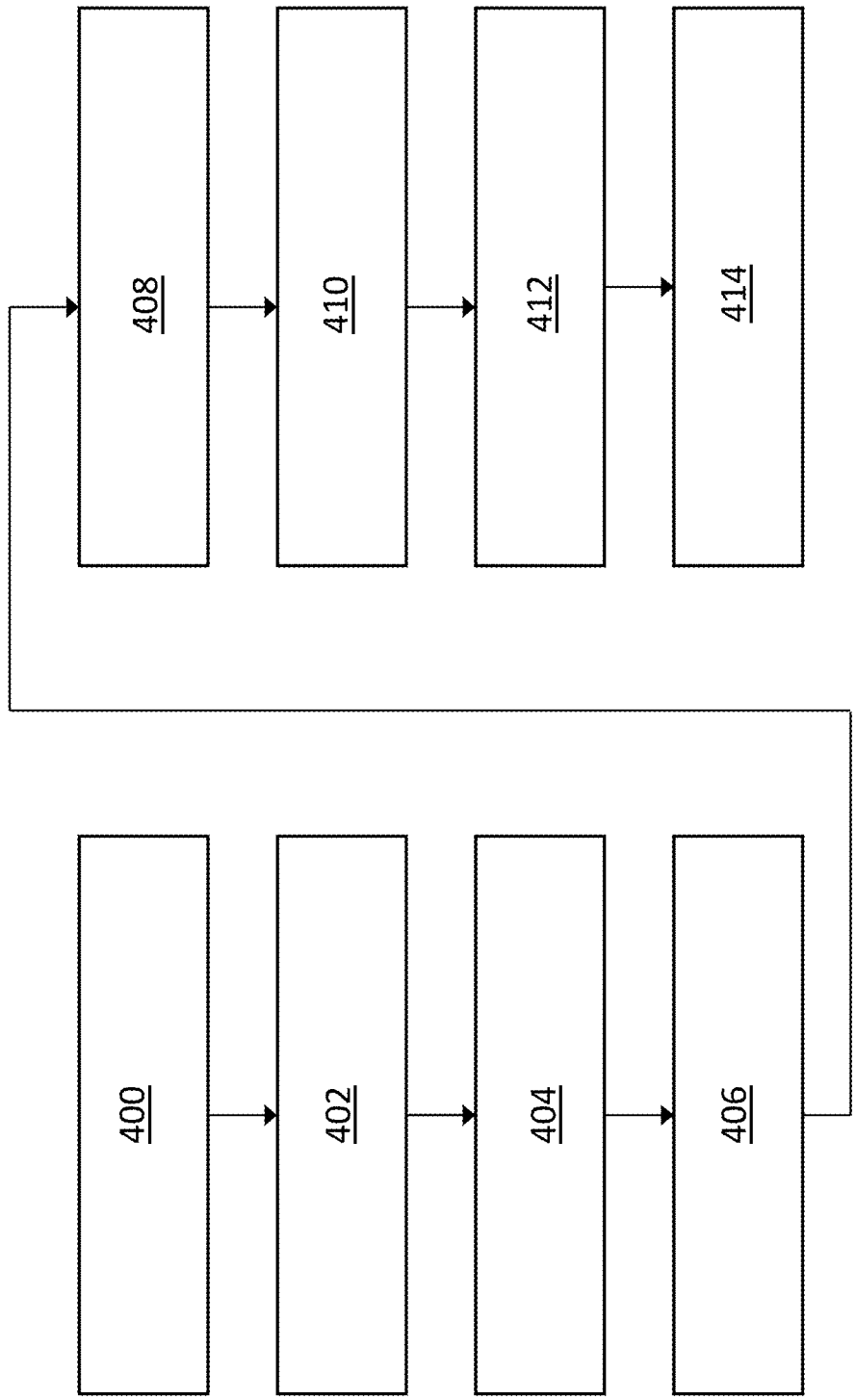

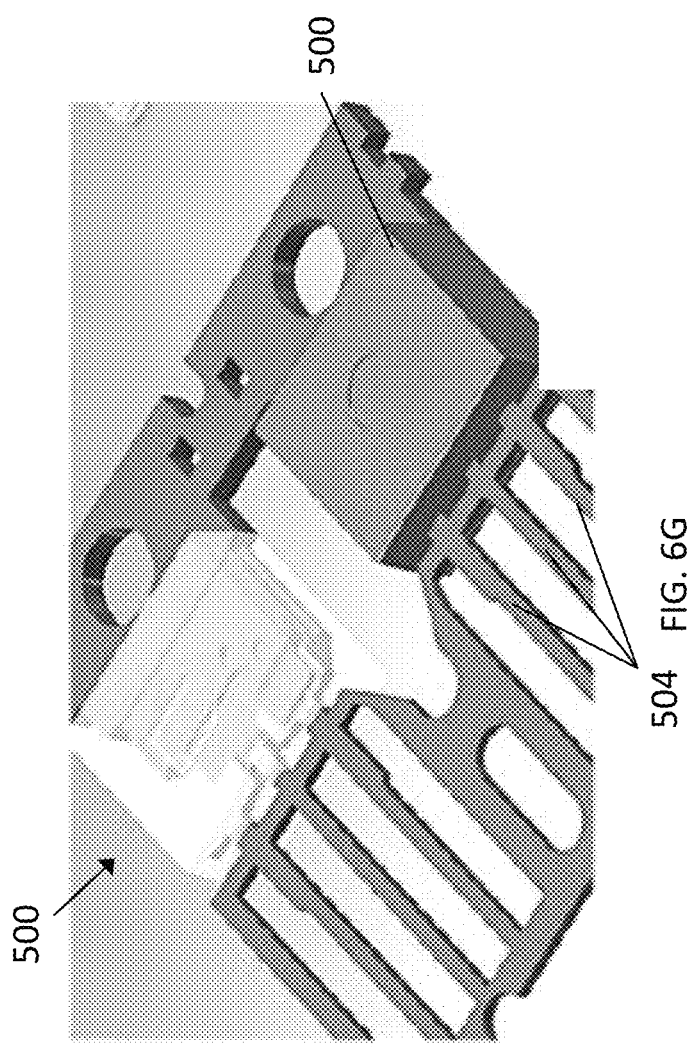

MULTI-DEVICE SEMICONDUCTOR CHIP WITH ELECTRICAL ACCESS TO DEVICES AT EITHER SIDE

BACKGROUND

Bidirectional switches offer many advantageous electrical properties which make them useful in a wide array of applications. Of particular interest are bidirectional switches that are realized in a single semiconductor device (package). However, current bidirectional switches realized in that manner may not exhibit sufficient power density. Furthermore, it may be desirable to reduce package size and/or the effort of production of such bidirectional switches.

SUMMARY

A semiconductor chip is disclosed. In an embodiment, the semiconductor chip comprises a semiconductor body comprising a main surface and a rear surface opposite the main surface, a first bond pad disposed on the main surface, a second bond pad disposed on the rear surface, a first switching device that is monolithically integrated in the semiconductor body and comprises a first input-output terminal that is electrically connected to the first bond pad, and a second switching device that is monolithically integrated in the semiconductor body and comprises a first input-output terminal that is electrically connected to the second bond pad.

Separately or in combination, the first and second switching devices form a bidirectional switch circuit that is connected in series between the first and second bond pads.

Separately or in combination, the first and second switching devices each further comprise a second input-output terminal, and the second input-output terminals of the first and second switching devices are electrically connected to one another by an electrical connection that is internal to the semiconductor body.

Separately or in combination, the semiconductor chip further comprises a third bond pad disposed on the main surface and a fourth bond pad disposed on the rear surface, the first switching device further comprises a control terminal that is electrically connected to the third bond pad, and the second switching device further comprises a control terminal that is electrically connected to the fourth bond pad.

Separately or in combination, the semiconductor chip further comprises a fifth bond pad disposed on a side surface of the semiconductor body that extends between the main and rear surfaces, and the second input-output terminals of the first and second switching devices are electrically connected to the fifth bond pad.

Separately or in combination, the first and second switching devices are each configured as power transistors.

Separately or in combination, the first and second switching devices are each configured as silicon carbide-based MOSFET devices or silicon carbide-based IGBTs.

Separately or in combination, a source zone of the first switching device adjoins a silicon-terminated surface of the semiconductor body and a source zone of the second switching device adjoins a carbon-terminated surface of the semiconductor body.

Separately or in combination, a source zone of the first switching device adjoins a silicon-terminated surface of the semiconductor body and a source zone of the second switching device adjoins a silicon-terminated surface of the semiconductor body.

Separately or in combination, the first input-output terminals of the first and second switching devices are source terminals, and the second input-output terminals of the first and second switching devices are drain terminals.

A semiconductor package is disclosed. In an embodiment, the semiconductor package comprises a semiconductor body comprising a main surface and a rear surface opposite the main surface, first and second switching devices that are each monolithically integrated in the semiconductor body, an electrically insulating encapsulant body that encapsulates the semiconductor chip, a first package contact that is electrically connected to the first switching device by a first bond pad that is disposed on the main surface, and a second package contact that is electrically connected to the second switching device by a second bond pad that is disposed on the rear surface.

Separately or in combination, the first and second switching devices each comprise a first input-output terminal and a second input-output terminal, the first input-output terminal of the first switching device is electrically connected to the first bond pad, the first input-output terminal of the second switching device is electrically connected to the second bond pad, and the second input-output terminals of the first and second switching devices are electrically connected to one another by an electrical connection that is internal to the semiconductor body.

Separately or in combination, the first and second switching devices form a bidirectional switch circuit that is connected in series between the first and second bond pads.

Separately or in combination, the encapsulant body is a dielectric substrate that comprises a first side and a second side opposite the first side, the semiconductor die is embedded within the dielectric substrate such that the main surface of the semiconductor body faces the first side of the dielectric substrate and such that the rear surface of the semiconductor body faces the second side of the dielectric substrate, the first package contact comprises a structured portion of a first metallization layer that is disposed on the first side of the dielectric substrate, and the second package contact comprises a structured portion of a second metallization layer that is disposed on the second side of the dielectric substrate.

Separately or in combination, the dielectric substrate is a laminate substrate that comprises a plurality of electrically insulting layers stacked on top of one another.

Separately or in combination, the first and second switching devices each comprise a control terminal, the control terminal of the first switching device is electrically connected to a third bond pad that is disposed on the main surface, the control terminal of the second switching device is electrically connected to a fourth bond pad that is disposed on the rear surface, and the semiconductor package further comprises a third package contact that is electrically connected to one or both of the third and fourth bond pads.

Separately or in combination, the semiconductor package further comprises an electrically conductive lead frame, the lead frame comprising a die pad and a plurality of leads, and wherein the first, second and third package contacts are provided by the leads.

Separately or in combination, the semiconductor chip is mounted on the die pad with the rear surface of the semiconductor body facing the die pad and with a portion of the rear surface of the semiconductor body that comprises the fourth bond pad laterally overhanging past the die pad, and the fourth bond pad is electrically connected to one of the leads.

Separately or in combination, the second input-output terminals of the first and second switching devices are electrically inaccessible from an exterior of the semiconductor package.

Separately or in combination, the semiconductor package further comprises a fifth package contact that is electrically connected to the second input-output terminals of the first and second switching devices by a fifth bond pad disposed on a side surface of the semiconductor body that extends between the main and rear surfaces.

Separately or in combination, the first and second switching devices are each configured as power transistors.

Separately or in combination, the first and second switching devices are each configured as silicon carbide-based MOSFET devices.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIG. 1A illustrates a circuit schematic of the bidirectional switch with a common drain configuration, and FIG. 1B illustrates a circuit schematic of the bidirectional switch with a common source configuration.

FIG. 3, which includes FIG. 3A illustrates a plan-view of a main surface of the semiconductor chip according to a first option, FIG. 3B illustrates a plan-view of a rear surface of the semiconductor chip according to the first option, FIG. 3C illustrates a plan-view of a main surface of the semiconductor chip according to a second option, and FIG. 3D illustrates a plan-view of a rear surface of the semiconductor chip according to the second option.

FIG. 5 illustrates a process flow for a method of forming an embedded semiconductor package, according to an embodiment.

FIG. 6, which includes FIGS. 6A, 6B, 6C, 6D, 6E, 6F and 6G, illustrate certain steps for producing a molded semiconductor package with a semiconductor chip that comprises multiple switching devices monolithically integrated therein, according to an embodiment. FIG. 6A illustrates providing a lead frame, FIG. 6B illustrates mounting a semiconductor chip on the lead frame, FIG. 6C illustrates forming an electrical interconnection between the semiconductor die and a package lead according to a first option, FIG. 6D illustrates forming an electrical interconnection between the semiconductor die and a package lead according to a second option, FIGS. 6E and 6F forming bond wire connections between bond pads of the semiconductor die and a package lead in two different isometric views, and FIG. 6G illustrates forming a molded encapsulant body on the lead frame.

DETAILED DESCRIPTION

Figure 1B:
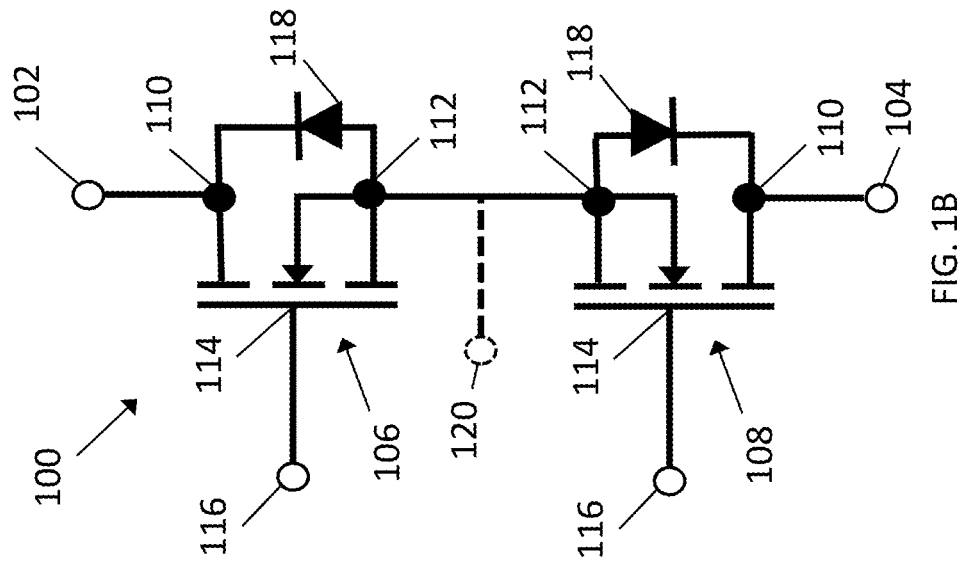
FIGS. 1A and 1B, illustrates a circuit schematic of a bidirectional switch, according to an embodiment.

Embodiments of a semiconductor chip that comprises two switching devices monolithically integrated therein are disclosed. The semiconductor chip is configured so that the two switching devices are electrically accessible at opposite facing sides of the semiconductor chip are disclosed herein. To this end, the semiconductor chip comprises first and second bond pads disposed on main and rear surfaces of the semiconductor chip, respectively. The first and second bond pads are connected to a first switching device and a second switching device, respectively. In one specific embodiment, the first switching device and the second switching form a bidirectional switch circuit that is connected in series between the first and second bond pads. A multi-device semiconductor chip according to any of the embodiments described herein provides advantages including reduced material consumption, reduction and simplification of processing steps, and improved thermal dissipation in comparison to a multi-chip equivalent circuit. This approach requires relatively lower resources and is therefore very environmentally friendly.

FIG. 1 illustrates a bidirectional switch circuit 100, according to two different embodiments. The bidirectional switch circuit 100 comprises a first bidirectional terminal 102 and a second bidirectional terminal 104. In an off-state of the bidirectional switch circuit 100, current is prohibited from flowing between the first and second bidirectional terminals 102, 104. In an on-state of the bidirectional switch circuit 100, current is permitted to flow between the first and second bidirectional terminals 102, 104 in either direction, i.e., from the first bidirectional terminal 102 to the second bidirectional terminal 104 or from the second bidirectional terminal 104 to the first bidirectional terminal 102.

The bidirectional switch circuit 100 comprises first and second switching devices 106, 108 that are connected in series between the first and second bidirectional terminals 102, 104. The first and second switching devices 106, 108 each comprise a first input-output terminal 110, a second input-output terminal 112, and a control terminal 114. The first input-output terminal 110 of the first switching device 106 is electrically connected to the first bidirectional terminal 102 and the first input-output terminal 110 of the second switching device 108 is electrically connected to the second bidirectional terminal 104. The second input-output terminal 112 of the first switching device 106 is electrically connected to the second input-output terminal 112 of the first switching device 106 at a central node of the bidirectional switch circuit 100. The control terminals 114 of the first and second switching devices 106, 108 are each connected to a control terminal 116 of the bidirectional switch circuit 100.

Figure 1A:
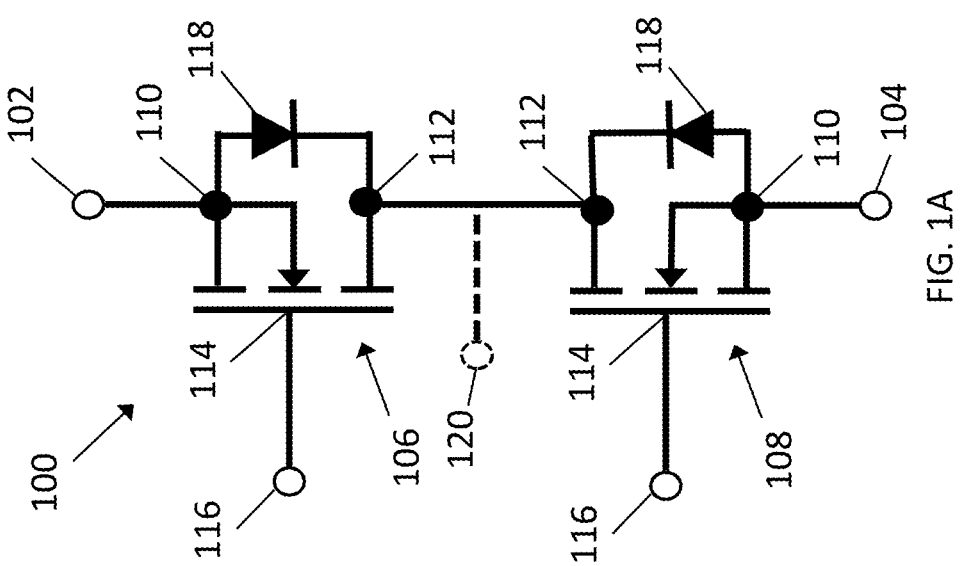

In the embodiment of FIG. 1A, the first and second switching devices 106, 108 are implemented as MOSFET transistors, with the first input-output terminals 110 of the first and second switching devices 106, 108 each corresponding to the source terminal, the second input-output terminals 112 of the first and second switching devices 106, 108 each corresponding to the drain terminal, and the control terminals 114 of the first and second switching devices 106, 108 each corresponding to gate terminal. The working principle of this bidirectional switch circuit 100 is as follows. A positive bias may be applied between the first and second bidirectional terminals 102, 104, e.g., 100V or more applied to the first bidirectional terminal 102 and 0V to the second bidirectional terminal 104. In an off-state of the bidirectional switch circuit 100, both of the first and second switching devices 106, 108 are in an off-state and no current flows between first and second bidirectional terminals 102, 104. In an on-state of the bidirectional switch circuit 100, the control terminal 116 of the bidirectional switch circuit 100 is biased to create a positive gate-source voltage in the second switching device 108 that is above its threshold voltage. For example, if the second bidirectional terminal 104 is biased at 0V, the control terminal 116 of the bidirectional switch circuit 100 can be biased at 5 V so that $V_{GS}$=5V. In this state, the second switching device 108 is turned on. Moreover, current is permitted to flow through an intrinsic body diode 118 of the first switching device 106. Thus, a conductive connection between the first and second bidirectional terminals 102, 104 is completed. Alternatively, a negative bias may be applied between the first and second bidirectional terminals 104, e.g., 100V or more applied to the second bidirectional terminal 104 and 0V to the first bidirectional terminal 102. In that case, the same bias applied to the control terminal 116 of the bidirectional switch circuit 100 creates a positive gate-source voltage $V_{GS}$ in the first switching device 108 that is above its threshold voltage. As a result, the first switching device 108 turns on and current is permitted to flow through the intrinsic body diode 118 of the second switching device 108.

In the embodiment of FIG. 1B, the first and second switching devices 106, 108 are also implemented as MOSFET transistors, but the polarity of these devices is reversed. Thus, the first input-output terminals 110 of the first and second switching devices 106, 108 each correspond to the drain terminal, the second input-output terminals 112 of the first and second switching devices 106, 108 each correspond to the source terminal. The working principle of the bidirectional switch circuit 100 of FIG. 1B is identical to that of FIG. 1A, except that the conductive state of each devices is reversed. Thus, if a positive voltage is applied between the first and second bidirectional terminals 102, 104, the bidirectional switch circuit 100 enters an on-state by turning the first switching device 106 on and with current flowing through the intrinsic body diode 118 of the second switching device 108.

While FIG. 1 illustrates the first and second switching devices 106, 108 implemented as N-type enhancement MOSFET transistors, this represents just one potential type of switching device that may be used to form the bidirectional switch circuit 100. More generally, the bidirectional switching device may comprise any type of active switching device that is configured to control current flowing in one or both directions between two terminals. Examples of these switching devices include any type of MOSFET, e.g., n-channel, p-channel, enhancement mode, depletion mode, etc. In another example, the first and second switching devices 106, 108 may be implemented with insulated gate bipolar transistors (IGBT), wherein the first and second input-output terminals 110, 112 correspond to the emitter and collector terminals, respectively (or vice-versa). In that case, the first and second switching devices 106, 108 may be configured as a so-called reverse conduction IGBT, which is a type of IGBT with an integrated body diode in parallel with its emitter and collector terminals. This integrated body diode provides a reverse conduction path, thereby enabling bidirectional current flow between the first and second bidirectional terminals 102, 104 in a similar manner as described above.

The bidirectional switch circuit 100 may optionally include a fourth terminal 120. The fourth terminal 120 is connected to the central node of the bidirectional switch circuit 100 that connects the second input-output terminals 112 of the first and second switching devices 106, 108 together. The fourth terminal 120 may provide sensing terminal, e.g., to determine the voltage and/or current flowing through the first and second switching devices 106, 108 during operation. This information can be used to detect and/or prevent the first and second switching devices 106, 108 from operating at potentially damaging conditions, such as breakdown conditions.

The bidirectional switch circuit 100 can be implemented using combinations of circuit elements different from or in addition to those shown in FIG. 1. For example, the bidirectional switch circuit 100 include multiple sets of the first and second switching devices 106, 108, with each set connected in parallel between the first and second bidirectional terminals 102, 104. In addition or in the alternative, the bidirectional switch circuit 100 can comprise separate diodes that are connected in parallel with the first and second input-output terminals 112 and have the same polarity of the intrinsic body diodes 118 as shown in the figure. In the case of a MOSFET configuration, these separate diodes can provide enhanced current carrying capability in comparison to the intrinsic body diode 118 of the device. In the case of an IGBT, these separate diodes can provide reverse conduction capability.

Figure 2:
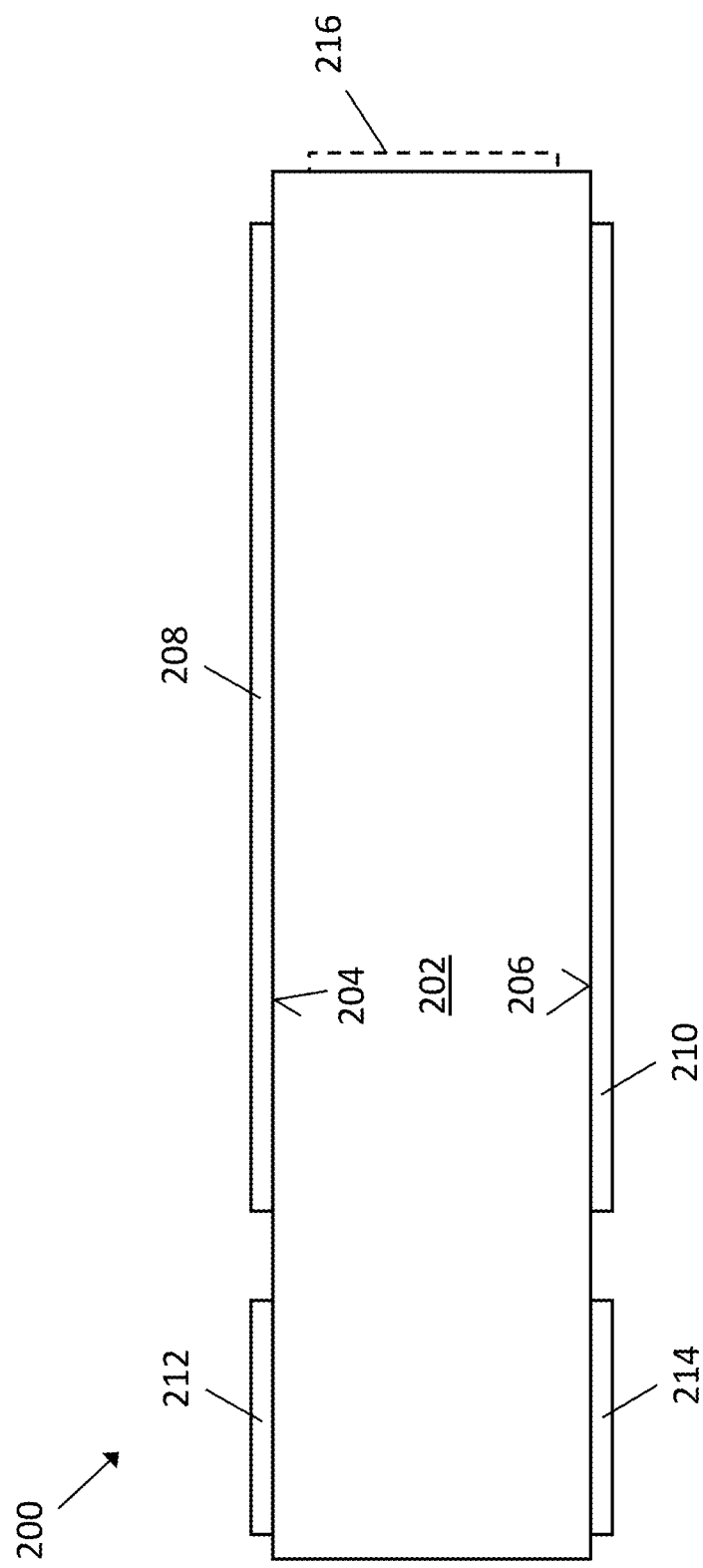
FIG. 2 illustrates a cross-sectional view of a semiconductor chip that comprises multiple switching devices monolithically integrated therein, according to an embodiment.
Figure 3C:
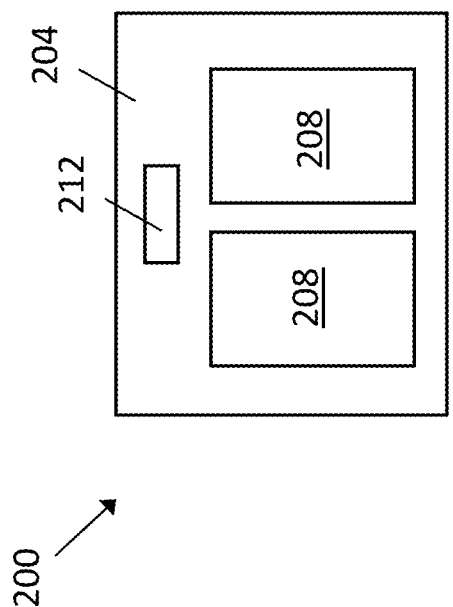
FIGS. 3A, 3B, 3C and 3D, illustrates a plan-view of a semiconductor chip that comprises multiple switching devices monolithically integrated therein, according to embodiments.
Figure 3D:
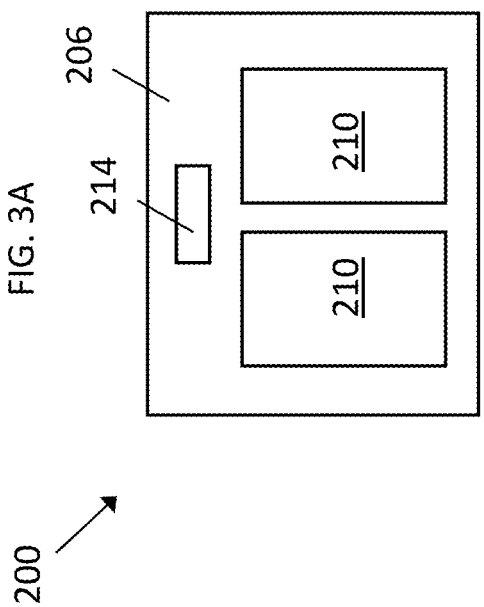
Figure 3A:
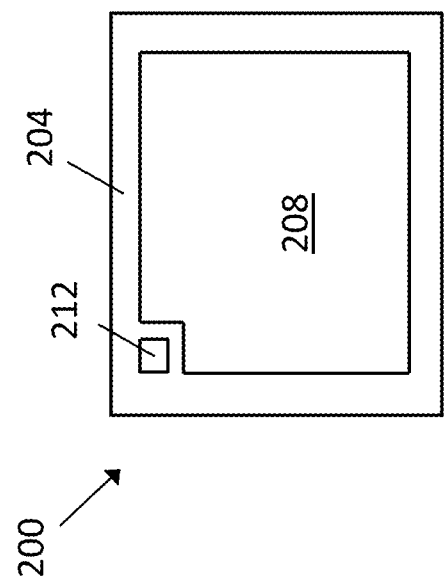
Figure 3B:
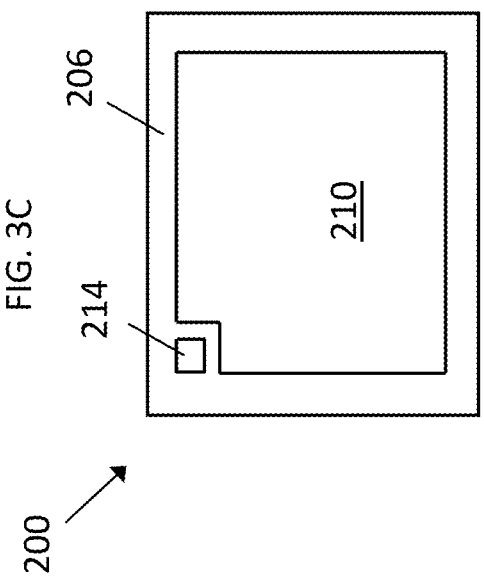

Referring to FIG. 2, a semiconductor chip 200 comprises a semiconductor body 202, which in turn comprises a main surface 204 and a rear surface 206 opposite the main surface 204. The semiconductor body 202 can comprise any of a variety of semiconductor materials including type IV semiconductors, e.g., silicon, silicon germanium, silicon carbide, etc., and type III-V semiconductors, e.g., gallium nitride, gallium arsenide, etc. Moreover, the semiconductor body 202 can comprise any one of these semiconductor materials throughout the entire semiconductor body 202 or can include any combinations thereof.

The first and second switching devices 106, 108 are each monolithically integrated in the semiconductor body 202. This means that the active device regions of the first and second switching devices 106, 108 (e.g., source, drain, body, etc.) are formed in the semiconductor material of the semiconductor body 202.

The semiconductor chip 200 has a multi-sided bond pad configuration so that at least one terminal of the first switching device 106 is electrically accessible via the main surface 204 and so that at least one terminal of the second switching device 108 is electrically accessible via the rear surface 206. To this end, semiconductor chip 200 comprises first and third bond pads 208, 212 that are disposed on the main surface 204 and second and fourth bond pads 210, 214 that are disposed on the rear surface 206. These bond pads can be structured regions of metallization, e.g., of copper, aluminum, alloys thereof, etc., that provide an outermost contact surface of the semiconductor chip 200.

According to an embodiment, the first and second switching devices 106, 108 are arranged in the semiconductor body 202 form a bidirectional switch circuit 100 that is connected in series between the first and second bond pads 208, 210. In this embodiment, the first input-output terminal 110 of the first switching device 106 is electrically connected to the first bond pad 208 and the first input-output terminal 110 of the second switching device 108 is electrically connected to the second bond pad 210. The control terminal 114 of the first switching device 106 can be electrically connected to the third bond pad 212 and the control terminal 114 of the second switching device 108 can be electrically connected to the fourth bond pad 214. In a different embodiment (not shown), the control terminals 114 of the first and second switching devices 106, 108 can be connected to bond pads that are disposed on the same side of the semiconductor body 202. In yet another embodiment (not shown), the control terminals 114 of the first and second switching devices 106, 108 can be connected to a single bond pad disposed on either side of the semiconductor body 202, e.g., if independent control of the switching devices is not necessary.

The second input-output terminals 112 of the first and second switching devices 106, 108 can be electrically connected to one another by an electrical connection that is internal to the semiconductor body 202. This means that the second input-output terminals 112 of the first and second switching devices 106, 108 are connected to one another by semiconducting material that is a constituent part of the semiconductor body 202 or by conductive material that is formed within the semiconductor body 202. For example, this electrical connection can be provided by a conductive structure of doped polysilicon or a metal via structure that is disposed within a trench of the semiconductor body 202. Alternatively, this electrical connection can be provided by forming the first and second switching devices 106, 108 to share a common doped active region (e.g., drain region) which form the second input-output terminals 112 of each device. In either example, this configuration frees up area on the main and rear surfaces 204, 206 by reducing the number of bond pads. This allows for the first and second bond pads 208, 210 to be enlarged, thereby reducing contact resistance of these connections.

Optionally, the semiconductor chip 200 may comprise a fifth bond pad 216 that is disposed on a side surface of the semiconductor chip 200 that extends between the main and rear surfaces 204, 206. The fifth bond pad 216 can be configured as a terminal connection to the second input-output terminals 112 of the first and second switching devices 106, 108. Thus, the fifth bond pad 216 can provide the sense terminal 120 of the bidirectional switch circuit 100. The fifth bond pad 216 can be electrically connected to the second input-output terminals 112 of the first and second switching devices 106, 108, e.g., by a metal or polysilicon line or by a direct connection with highly doped semiconductor material. In another embodiment, the second input-output terminals 112 of the first and second switching devices 106, 108 are electrically inaccessible such that there is no bond pad connection to these terminals from an exterior surface of the semiconductor chip 200.

In an embodiment wherein the first and second switching devices 106, 108 are SiC-based switches, the source zone of the first switching device 106 adjoins a silicon-terminated surface of the chip 200 and the source zone of the second switching device 108 adjoins a carbon-terminated surface of the chip. Alternatively, depending on fabrication process, the source zone of the first switching device 106 can adjoin a silicon-terminated surface of the chip 200 and the source zone of the second switching device 108 is adjoining a silicon-terminated surface of the chip 200 as well. A silicon-terminated surface refers to a contact surface of the semiconductor body 202 that is predominantly silicon. Likewise a carbon-terminated surface refers to a contact surface of the semiconductor body 202 that is predominantly carbon.

In an embodiment, the first and second switching devices 106, 108 are configured as vertical devices. This means that the first and second switching devices 106, 108 are configured to conduct in a direction that is perpendicular to the main surface 204 of the semiconductor body 202. In one particular example of a vertical device configuration, the doped active region that corresponds to the first input-output terminal 110 of the first switching device 106 (e.g., the source region) extends to the main surface 204 and the doped active region that corresponds to the first input-output terminal 110 of the second switching device 108 (e.g., the source region) extends to the rear surface 206. In that case, the first and second bond pads 208, 210 can be in direct low-ohmic contact with the doped active region of each device.

In an embodiment, the first and second switching devices 106, 108 are configured as lateral devices. This means that the first and second switching devices 106, 108 are configured to conduct in a direction that is parallel to the main surface 204 of the semiconductor body 202. In one particular example of a lateral device configuration, each of the doped active regions of the first switching device 106 (e.g., the source, body and drain in the case of a MOSFET) extend to the main surface 204, and each of the doped active regions of the second switching device 108 extend to the rear surface 206 of the semiconductor body 202. In that case, the first and second bond pads 208, 210 can be in direct low-ohmic contact with the first input-output terminal 110 of the first and second switching devices 106, 108, respectively.

In an embodiment, the first and second switching devices 106, 108 are each configured as power transistors. A power transistor is a transistor that is rated to control voltages of 100 V (volts) or more and/or is rated to control currents of 1 A (amperes) or more. More commonly, power transistors are configured to control voltages on the order of 500 V to 1700V or even up to 3.3 kV and/or currents on the order of 10 A to 100 A or more. These high voltage ratings and/or current ratings are achieved through appropriate tailoring of the physical parameters of the devices, such as length and dopant concentration of the drift region, thickness and material type of the base semiconductor material which forms the active doped regions, thickness and material type of dielectric material, etc. In one specific embodiment, the first and second switching devices 106, 108 are configured as silicon carbide-based power MOSFET devices. This means that the source, drain and body regions of the first and second switching devices 106, 108 are formed in silicon carbide material. Due to the higher breakdown field strength and thermal conductivity of SiC material, an SiC based transistor offers superior voltage blocking and better thermal performance in comparison to a counterpart silicon based transistor.

Referring to FIG. 3, two potential bond pad configurations for the semiconductor chip 200 are depicted. FIG. 3A depicts the main surface 204 of the semiconductor chip 200 and FIG. 3B depicts the rear surface 206 of the semiconductor chip 200 according to a first option. In this embodiment, the semiconductor chip 200 comprises two of the first bond pads 208 on the main surface 204 and two of the second bond pads 210 on the rear surface 206. The pairs of bond pads on each surface can connect to a single device or can form separate connections to two devices that are parallel to one another. FIG. 3C depicts the main surface 204 of the semiconductor chip 200 and FIG. 3D depicts the rear surface 206 of the semiconductor chip 200 according to a second option. In this embodiment, the semiconductor chip 200 comprises one of the first bond pads 208 that occupies a substantial majority of the main surface 204 and one of the second bond pads 210 that occupies a substantial majority of the rear surface 206. This may be preferred to lower the resistance of the terminal connection, for example. More generally, the geometry of the bond pads can be tailored to particular design requirements. Moreover, the geometry of the bond pads on each side of the semiconductor chip 200 is not necessarily the same.

By configuring the semiconductor chip 200 to comprise the first and second switching devices 106, 108 monolithically integrated therein, the following advantages can be realized. The semiconductor chip 200 makes efficient use of semiconductor material in comparison to a multi-chip solution, which may be particularly beneficial in the case of costly semiconductors such as silicon carbide. Moreover, the multi-device integration allows for at least some of the processing steps for forming each switching device to be shared. For example, a post implantation annealing step can be used to activate the dopants of the active doped regions for both of the first and second switching devices 106, 108. Moreover, an improvement to heat capacity and heat conductivity can be realized. For example, by incorporating both semiconductor devices into high thermal conductivity material such as silicon carbide, thermal dissipation resulting from interconnect (e.g., clips, solder, etc.) can be eliminated.

Figure 4:
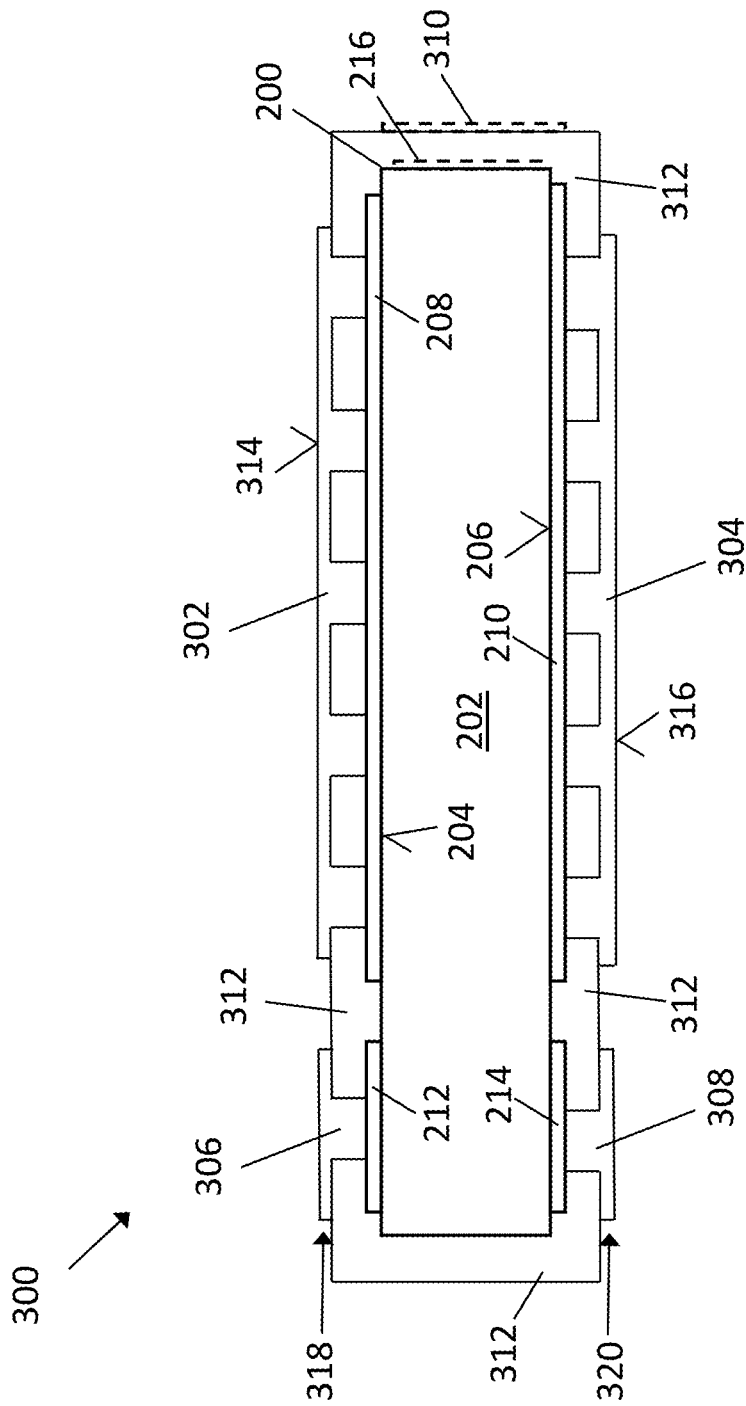
FIG. 4 illustrates a cross-sectional view of an embedded semiconductor package with a semiconductor chip that comprises multiple switching devices monolithically integrated therein, according to an embodiment.

FIGS. 4-6 disclose embodiments of a semiconductor package 300 and a method of producing the semiconductor package 300. The semiconductor package 300 comprises the semiconductor chip 200 as described herein. This semiconductor package 300 advantageously provides a multi-device circuit such as the bidirectional switch circuit 100 in a single package. Thus, carrier level interconnections between the terminals of the devices such as conductive tracks, clips, wire bonds, etc. can be eliminated from the circuit, thereby reducing parasitic effects. In addition to the depicted embodiment, this semiconductor package 300 can more generally have a wide variety of package types. Examples of these package types include through-hole style packages, surface mount packages, flat packages, and embedded packages.

The semiconductor package 300 may comprise a first package contact 302, a second package contact 304, a third package contact 306, and a fourth package contact 308. Each of these package contacts 302, 304, 306, 308 are externally accessible points of electrical contact to the various terminals of the semiconductor chip 200. The first package contact 302 is electrically connected to the first switching device 106 by the first bond pad 208. The second package contact 304 is electrically connected to the second switching device 108 by the second bond pad 210. The third package contact 306 is electrically connected to the first switching device 106 by the third bond pad 212. The fourth package contact 308 is electrically connected to the second switching device 108 by the fourth bond pad 214. Thus, the first package contact 302 provides an externally accessible point of electrical contact to the first input-output terminal 110 of the first switching device 106, the second package contact 304 provides an externally accessible point of electrical contact to the first input-output terminal 110 of the second switching device 108, and so-forth. Optionally, the semiconductor package 300 may comprise a fifth package contact 310 that is electrically connected to the fifth bond pad 216 (if present). This fifth package contact 310 can be disposed on any side of the semiconductor package 300.

Referring to FIG. 4, an embodiment of the semiconductor package 300 configured as an embedded package is depicted. An embedded package refers to a particular type of semiconductor package that does not utilize bond wires and soldering techniques for package interconnect. In an embedded package, the package interconnect is provided by galvanic plating techniques. In some cases, an embedded package may not include a chip carrier (e.g., a lead frame) to which a semiconductor die is mounted. In the depicted embodiment, a dielectric substrate 312 serves as an encapsulant body of the semiconductor package 300. The dielectric substrate 312 comprises a first side 314 that is above the main surface 204 of the semiconductor body 202 and a second side 316 that is below the rear surface 206 of the semiconductor body 202. The dielectric substrate 312 can comprise epoxy materials, blended epoxy and glass fiber materials such as FR-4, FR-5, CEM-4, etc., and resin materials such as bismaleimide trazine (BT) resin. The dielectric substrate 312 of the embedded package can be formed by a lamination technique wherein multiple layers of electrically insulating material are successively stacked on top of one another, an example of which will be described in further detail below. Alternatively, the dielectric substrate 312 of the embedded package can be formed by a molding technique such as compression molding.

In the embodiment of FIG. 4, the package contacts 302, 304, 306 and 308 are provided by structured regions of metallization that are disposed on the first and second sides 314, 316 of the dielectric substrate 312. Specifically, the first package contact 302 comprises a structured portion of a first metallization layer 318 that is disposed on the first side 314 of the dielectric substrate 312, the second package contact 304 comprises a structured portion of a second metallization layer 320 that is disposed on the second side 316 of the dielectric substrate 312, and so forth. The first and second metallization layers 318, 320 can be deposited layers of electrically conductive metal, e.g., copper, aluminum, etc. Trenches may be formed in the dielectric substrate 312 so that the structured portions of the first and second metallization layers 318, 210 can reach the bond pads of the semiconductor chip 200. These trenches may be filled with a conductive via structure, e.g., a tungsten plug. Alternatively, the package contacts 302, 304, 306 and 308 may be continuous metal structures that extend into the trenches in the dielectric substrate 312 and reach the bond pads of the package.

Referring to FIG. 5, a first process step 400 in a method of forming the embedded semiconductor package 300 comprises providing a carrier structure. The carrier structure may comprise an electrically insulating substrate with a metal layer, e.g., a Cu or Al foil, disposed thereon.

According to a second process step 402 of the method, the semiconductor chip 200 is placed on the carrier structure with the rear surface 206 of the semiconductor chip 200 facing and disposed on the metal foil. Optionally, multiple ones of the semiconductor chips 200 can be placed on a single carrier structure and the subsequent process steps can be performed in parallel to form multiple semiconductor packages 300.

According to a third process step 404 of the method, the dielectric substrate 312 is partially formed on the carrier so that the main surface 204 of each semiconductor chip 200 is covered with dielectric material. In one example, this is done by a lamination technique whereby layers of electrically insulating material are successively stacked on top of one another. Each constituent layer can generally comprise any dielectric material that is suitable for semiconductor encapsulation. Examples of these dielectric materials include epoxy materials, blended epoxy and glass fiber materials such as FR-4, FR-5, CEM-4, etc., and resin materials such as bismaleimide trazine (BT) resin. According to another embodiment, the dielectric material is formed by a molding technique, According to this technique, the carrier and/or each semiconductor die are arranged within the mold cavity of a mold tool. A molding material such as an epoxy material or thermosetting resin is injected into the mold cavity and subsequently hardened.

According to a fourth process step 406 of the method, the dielectric material is hardened, detached from the carrier structure and flipped upside down such that the rear surface 206 of each semiconductor chip 200 faces away from the carrier structure.

According to a fifth process step 408 of the method, further dielectric material is formed such that the rear surface 206 of each semiconductor chip 200 is covered by the dielectric material. This may be done using either the lamination technique or the molding technique described with reference to the third process step 404. As a result, a dielectric substrate 312 that covers both sides of the semiconductor chip 200 is produced.

According to a sixth processing step 410 of the method, holes or trenches are formed in the dielectric substrate 312. These holes or trenches are formed to expose the bond pads of the semiconductor chip 200, e.g., the first, second, third and fourth bond pads 208, 210, 212, 214, as needed. This may be done using a drilling technique such as laser drilling, for example. Alternatively, this may be done using an etching technique.

According to a seventh processing step 412 of the method, the first and second metallization layers 318, 320 are deposited on both sides of the dielectric substrate 312. These metallization layers 318, 320 can be formed by a plating technique, e.g., electroplating or electroless plating, wherein the exposed portions of the bond pads act as a seed for the plating process. These metallization layers 318, 320 can comprise a variety of conductive metals, e.g., Cu, Al, Ni, etc., and alloys thereof. These metallization layers 318, 320 can be formed as continuous layers which cover both sides of the dielectric substrate 312 and fill each holes or trenches are formed in the dielectric substrate 312.

According to an eighth processing step 414 of the method, the metallization layers disposed on either side of the dielectric substrate 312 may be structured so as to form portions of metallization that are laterally isolated from one another. This may be done using a masked etching technique, for example.

Referring to FIG. 6, selected steps for forming a semiconductor package 300 that is configured as a molded package are depicted. In this embodiment, the semiconductor package 300 comprises a lead frame 500, which acts as a chip carrier. The lead frame 500 can comprise an electrically conductive metal such as copper, aluminum, etc., and alloys thereof. The lead frame 500 comprises a die pad 502 and a plurality of electrically conductive leads 504. In this embodiment, the leads 504 provide first, second, and third package contacts that are respectively electrically connected to the first, second, third and fourth bond pads 208, 210, 212, 214 of the semiconductor chip 202 (wherein the third and fourth bond pads 212, 214 are connected to one of the leads 504). If necessary, one of the leads 504 can provide an additional package contact that is electrically connected to the fifth bond pad 216 (if present)

Figure 6B:
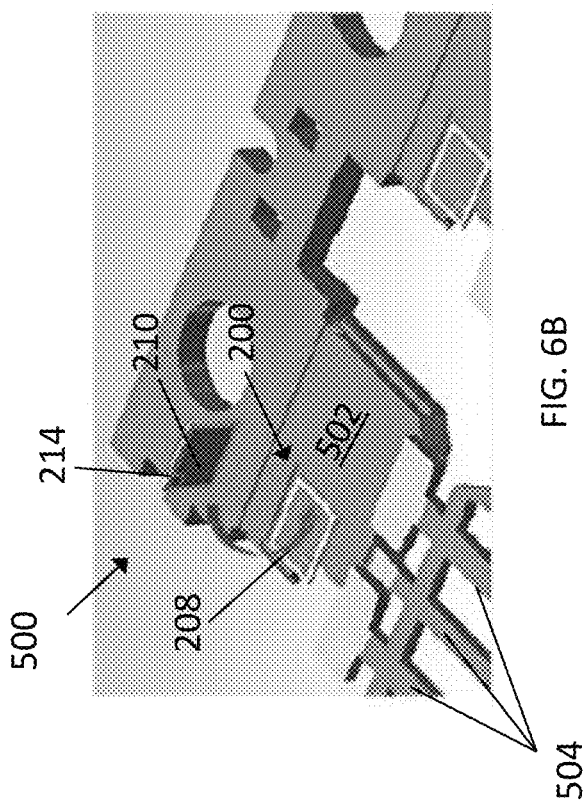
Figure 6A:
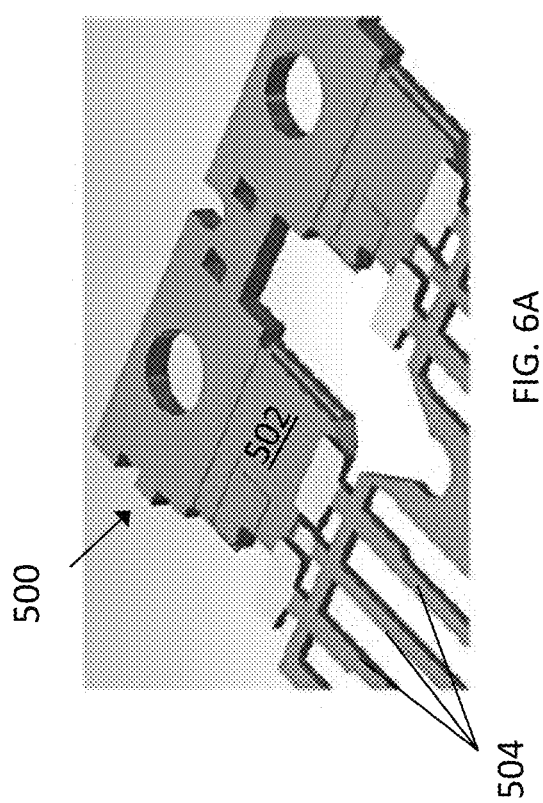

Referring to FIG. 6A, a lead frame 500 that comprises a die pad 502 and a plurality of electrically conductive leads 504 is provided. As shown, the lead frame 500 can be part of a unit lead frame wherein the leads 504 and the die pad 502 are attached to a peripheral ring of a lead frame strip. The same basic structure is repeated in the lead frame strip so that multiple semiconductor packages 300 can be produced at once.

Referring to FIG. 6B, the semiconductor chip 200 is mounted on the die pad 502. The semiconductor chip 200 is mounted such that the second bond pad 210 faces and is electrically connected to the die pad 502. A conductive adhesive, e.g., solder, sinter, conductive glue, etc., can be provided between the second bond pad 210 and the die pad 502 to effectuate this connection. One of the leads 504 can merge with the die pad, and thus forms a second package contact that is directly electrically connected to the second bond pad 210.

According to an embodiment, the semiconductor chip 200 is mounted on the die pad 502 such that a portion of the rear surface 206 that comprises the fourth bond pad 214 laterally overhangs past the die pad 502. That is, the semiconductor chip 200 is mounted in a partially overlapping arrangement such that a non-overlapping portion of the semiconductor chip 200 that comprises the fourth bond pad 214 is accessible from underneath the semiconductor chip 200.

Figure 6D:
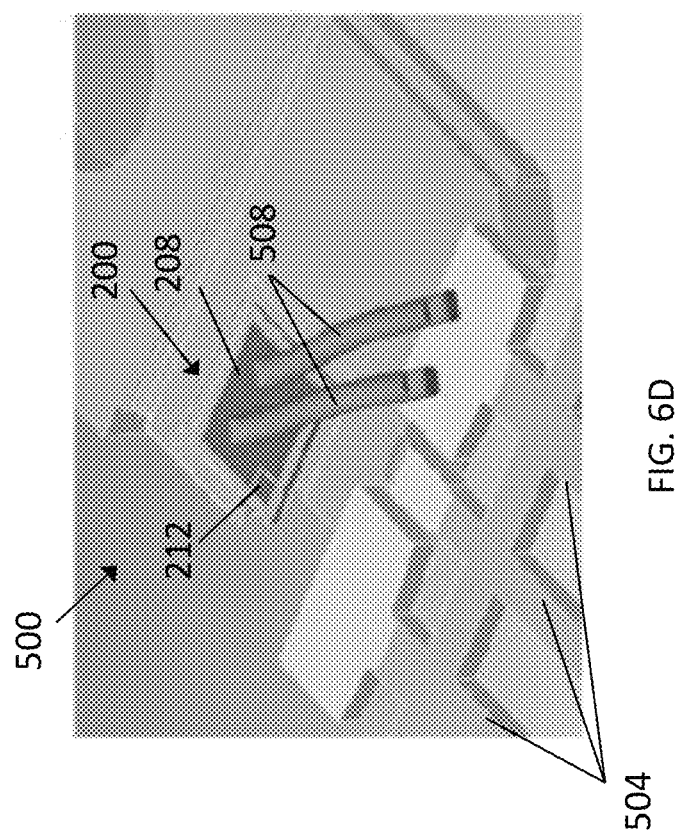
Figure 6C:
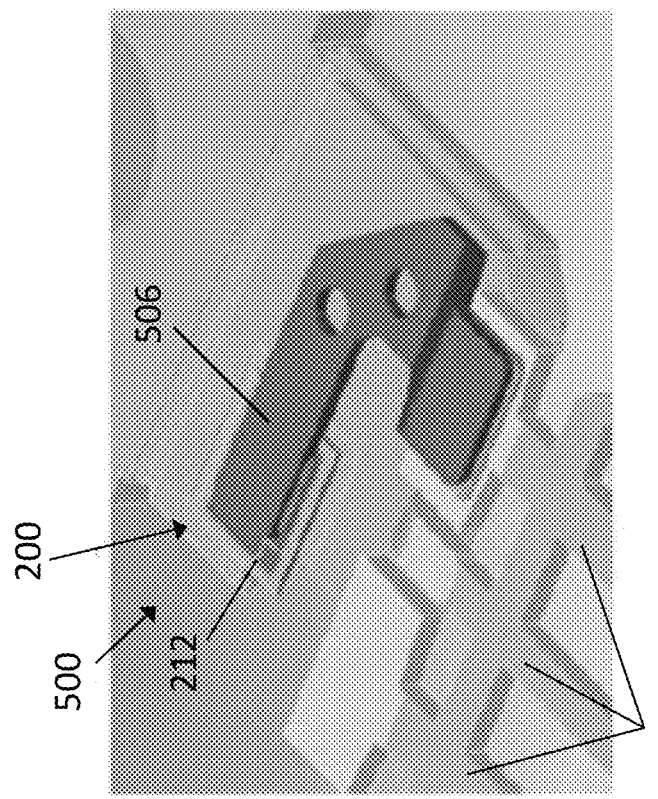

Referring to FIGS. 6C and 6D, two different techniques for electrically connecting the first bond pad 208 to one of the leads 504 are shown. In the option shown in FIG. 6C, a metal interconnect clip 506 is connected with the first bond pad 208 and a contact pad associated with one of the leads 504. A conductive adhesive such as solder may be provided at one or both interfaces with the metal interconnect clip 506. In the option shown in FIG. 6D, bond wires 508 are provided between the first bond pad 208 and a contact pad associated with one of the leads 504. These bond wires 508 may be attached using a wire bonding technique, for example. In either case, the connected lead 502 provides a first package contact that is electrically connected to the first bond pad 208. The bond wires 508 may comprise aluminum, copper, other metals, and alloys thereof.

Figure 6F:
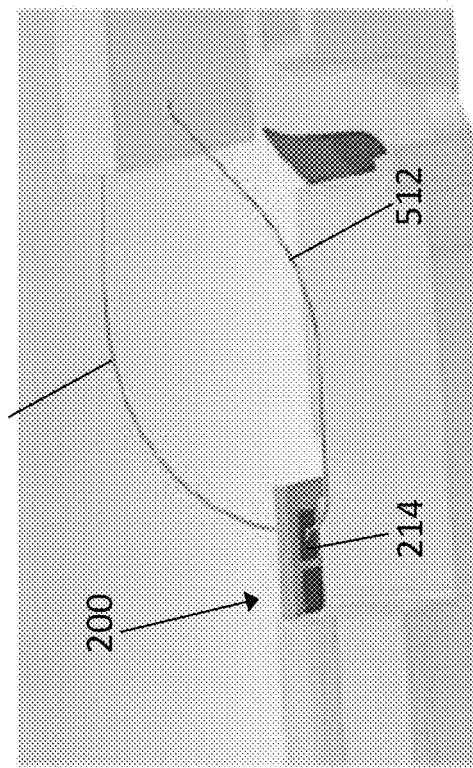
Figure 6E:
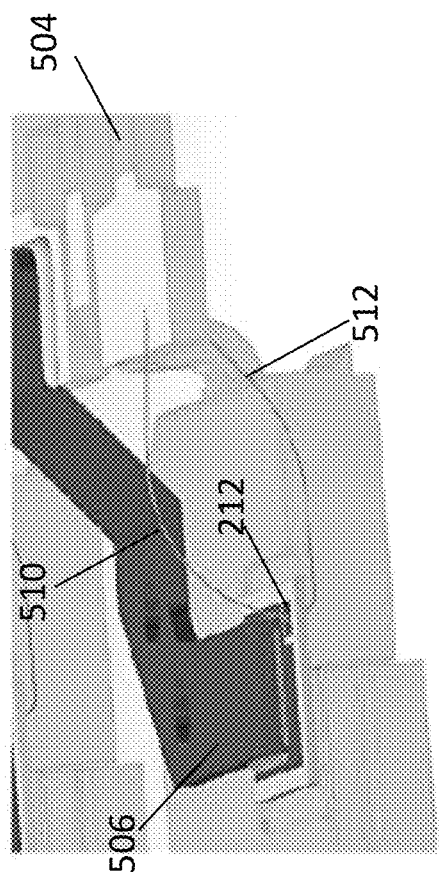

Referring to FIGS. 6E and 6F, the third and fourth bond pads 212, 214 are each electrically connected to one of the leads 504. A first bond wire 510 is provided between the third bond pad 212 and an upper side of a contact pad that is associated with one of the leads 504. A second bond wire 512 is provided between the fourth bond pad 214 and a lower side of a contact pad that is associated with one of the leads 504. In this case, a single lead provides a third package contact that is electrically connected to both of the first and second bond pads 212, 214. Alternatively, if independent control of the first and second switching devices 106, 108 is needed, the first and second bond wires 510, 512 can be routed to separate leads 504.

Referring to FIG. 6G, after forming the necessary electrical interconnections, an encapsulant body 514 is formed on the lead frame 500. This may be done using a molding process such as injection molding, compression molding, transfer molding, etc. The encapsulant body 514 can comprise an electrically insulating mold compound material, e.g., epoxy, thermosetting plastic, etc. Subsequently, a lead trimming process may be performed to sever the dambars between each of the leads 504 and detach the lead frames 500 from the peripheral ring of the lead frame strip.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a semiconductor chip that comprises a semiconductor body comprising a main surface and a rear surface opposite the main surface;
first and second switching devices that are each monolithically integrated in the semiconductor body;
an electrically insulating encapsulant body that encapsulates the semiconductor chip;
a first package contact that is electrically connected to the first switching device by a first bond pad that is disposed on the main surface; and
a second package contact that is electrically connected to the second switching device by a second bond pad that is disposed on the rear surface.

2. The semiconductor package of claim 1, wherein the first and second switching devices each comprise a first input-output terminal and a second input-output terminal, wherein the first input-output terminal of the first switching device is electrically connected to the first bond pad, wherein the first input-output terminal of the second switching device is electrically connected to the second bond pad, and wherein the second input-output terminals of the first and second switching devices are electrically connected to one another by an electrical connection that is internal to the semiconductor body.

3. The semiconductor package of claim 2, wherein the first and second switching devices form a bidirectional switch circuit that is connected in series between the first and second bond pads.

4. The semiconductor package of claim 2, wherein the encapsulant body is a dielectric substrate that comprises a first side and a second side opposite the first side, wherein the semiconductor die is embedded within the dielectric substrate such that the main surface of the semiconductor body faces the first side of the dielectric substrate and such that the rear surface of the semiconductor body faces the second side of the dielectric substrate, wherein the first package contact comprises a structured portion of a first metallization layer that is disposed on the first side of the dielectric substrate, and wherein the second package contact comprises a structured portion of a second metallization layer that is disposed on the second side of the dielectric substrate.

5. The semiconductor package of claim 4, wherein the dielectric substrate is a laminate substrate that comprises a plurality of electrically insulating layers stacked on top of one another.

6. The semiconductor package of claim 2, wherein the first and second switching devices each comprise a control terminal, wherein the control terminal of the first switching device is electrically connected to a third bond pad that is disposed on the main surface, wherein the control terminal of the second switching device is electrically connected to a fourth bond pad that is disposed on the rear surface, and wherein the semiconductor package further comprises a third package contact that is electrically connected to one or both of the third and fourth bond pads.

7. The semiconductor package of claim 6, further comprising an electrically conductive lead frame, the lead frame comprising a die pad and a plurality of leads, and wherein the first, second and third package contacts are provided by the leads.

8. The semiconductor package of claim 7, wherein the semiconductor chip is mounted on the die pad with the rear surface of the semiconductor body facing the die pad and with a portion of the rear surface of the semiconductor body that comprises the fourth bond pad laterally overhanging past the die pad, and wherein the fourth bond pad is electrically connected to one of the leads.

9. The semiconductor package of claim 2, wherein the second input-output terminals of the first and second switching devices are electrically inaccessible from an exterior of the semiconductor package.

10. The semiconductor package of claim 2, wherein the semiconductor package further comprises a fifth package contact that is electrically connected to the second input-output terminals of the first and second switching devices by a fifth bond pad disposed on a side surface of the semiconductor body that extends between the main and rear surfaces.

11. The semiconductor package of claim 1, wherein the first and second switching devices are each configured as power transistors.

12. The semiconductor package of claim 1, wherein the first and second switching devices are each configured as silicon carbide-based MOSFET devices.

* * * * *